(12) United States Patent
Kil et al.

(10) Patent No.: US 7,569,336 B2
(45) Date of Patent: Aug. 4, 2009

(54) COMPOSITION FOR REMOVING PHOTORESIST AND METHOD OF FORMING A PATTERN USING THE SAME

(75) Inventors: Jun-Ing Kil, Yongin-si (KR); Sok-Ho Yi, Yongin-si (KR); Kyong-Hee Kim, Gwangju-si (KR); Hee Seo, Yongin-si (KR); Bon-Wang Koo, Yongin-si (KR); Min-Young Kim, Incheon (KR)

(73) Assignee: Ram Technology Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/533,930

(22) Filed: Sep. 21, 2006

(65) Prior Publication Data

US 2007/0128539 A1 Jun. 7, 2007

(30) Foreign Application Priority Data

Nov. 18, 2005 (KR) .................. 10-2005-0110589

(51) Int. Cl.
*G03F 7/00* (2006.01)
*G03F 7/42* (2006.01)

(52) U.S. Cl. ............... 430/331; 430/311; 430/270.1; 510/201; 510/176; 510/175

(58) Field of Classification Search ........... 430/270.1, 430/333, 331; 510/201, 175, 176; 252/79.1
See application file for complete search history.

(56) References Cited

U.S. PATENT DOCUMENTS

| | | | |
|---|---|---|---|
| 6,916,772 B2 * | 7/2005 | Zhou et al. | 510/201 |
| 2003/0158058 A1 * | 8/2003 | Yoon et al. | 510/175 |

FOREIGN PATENT DOCUMENTS

| | | |
|---|---|---|
| JP | 2003-068699 | 3/2003 |
| KR | 1020000016878 A | 3/2000 |
| KR | 2003021732 A * | 3/2003 |

* cited by examiner

*Primary Examiner*—Amanda C. Walke
(74) *Attorney, Agent, or Firm*—Daly, Crowley, Mofford & Durkee, LLP

(57) ABSTRACT

In a method of forming a pattern using a composition for removing photoresist, a layer is formed on a substrate, and then a photoresist pattern is formed on the layer. A portion of the layer exposed by the photoresist pattern is etched using the photoresist pattern as an etching mask to form the pattern on the substrate. Then, the photoresist pattern is removed using the composition including hydroxylamine, an alkanolamine-based compound, a morpholine-based compound, a polar solvent, a corrosion preventing agent, and water. The composition may effectively remove a photoresist pattern and etched residues without damaging the substrate and/or the pattern including metal, nitride, oxide and/or metal nitride.

14 Claims, 2 Drawing Sheets

COMPOSITION FOR REMOVING PHOTORESIST AND METHOD OF FORMING A PATTERN USING THE SAME

CROSS-REFERENCE TO RELATED APPLICATION

This application claims priority under 35 USC § 119 to Korean Patent Application No. 2005-110589 filed on Nov. 18, 2005, the contents of which are incorporated herein by reference in their entirety.

BACKGROUND OF THE INVENTION

1. Field of the Invention

Example embodiments of the present invention relate to a composition for removing photoresist and a method of forming a pattern using the composition. More particularly, example embodiments of the present invention relate to a composition for effectively removing photoresist without remaining residues, and a method of forming a pattern using the composition.

2. Description of the Related Art

As information processing apparatuses have been increasingly widely used, semiconductor devices employed in the information processing apparatuses have been rapidly developed in order to meet accordingly produced cutting-edge technologies. Semiconductor devices used today are manufactured to ensure rapid response speeds and high storage capacities. To acquire characteristics such as the rapid response speeds and high storage capacities, semiconductor manufacturing technologies have been pursued to obtain high integration degrees, accordingly, a process for forming minute patterns such as a photolithography process becomes more important in manufacturing semiconductor devices.

In the conventional photolithography process, a photoresist film is coated on a substrate or a layer to be patterned, and then the photoresist film is exposed and developed to form a photoresist pattern on the substrate or the layer to be patterned. Using the photoresist pattern as an etching mask, the substrate or the layer to be patterned is etched. Then, the photoresist pattern and etched residues are removed from the substrate and/or a pattern formed on the substrate.

Meanwhile, a photoresist pattern is used as an ion implantation mask in an ion implantation process for forming an impurity region in the substrate.

The photoresist pattern employed in the photolithography process or the ion implantation process should be completely removed to ensure desired electrical characteristics of a semiconductor device. Particularly, the photoresist pattern and etched residues are removed without damaging the substrate and an underlying pattern when the photoresist pattern is formed on the underlying pattern including oxide, silicide, polysilicon, polyimide, metal nitride or metal such as aluminum or tungsten.

To remove the photoresist pattern and the etched residues without damaging the underlying pattern, Korean Laid-Open Patent Publication No. 2000-16879 discloses a conventional composition for removing photoresist that includes at least one of alkoxy N-hydroxylalkil alkanamide, a polar material having a bipolar moment above 3, a damage preventing agent and alkanolamine. Additionally, Japanese Laid-Open Patent Publication No. 2003-68699 discloses a conventional cleaning solution for removing the etched residues, which includes alkanolamine, an organic solvent, and a sulfoxide compound including fluorine compound.

The conventional composition and the conventional cleaning solution effectively remove the photoresist pattern, however, the conventional composition and the conventional cleaning solution do not completely remove etched residues having dimensions of nano-meters generated from a metal pattern in a current semiconductor device. Particularly, the conventional composition and the conventional etching solution do not effectively remove minute etched residues generated in manufacturing processes for forming a static random access memory (SRAM) device or a flash memory device. Thus, electrical failures of the SRAM device and the flash memory device may be caused by remaining etched residues. Further, the contact resistance of a contact in a semiconductor device may increase when etched residues including polymers remain in a contact hole where the contact is positioned.

Since a current semiconductor device includes a wiring formed using various metals such as aluminum, titanium, tantalum, tungsten and/or copper, etched residues including organic polymers and metallic polymers are completely removed to ensure desired characteristics of the semiconductor device and to reduce manufacturing cost of the semiconductor device. Therefore, there is still demanded a novel composition for removing photoresist to completely remove a photoresist pattern and etched residues including polymers without damaging a substrate and a metal pattern formed on the substrate.

SUMMARY OF THE INVENTION

Example embodiments of the present invention provide a composition for removing photoresist capable of effectively removing photoresist and etched residues without damaging a structure to be patterned and/or a substrate.

Example embodiments of the present invention provide a method of forming a pattern having desired dimensions and shapes using the composition.

According to one aspect of the present invention, there is provided a composition for removing photoresist including hydroxylamine, an alkanolamine-based compound, a morpholine-based compound, a polar solvent, a corrosion preventing agent and water. The composition may include about 5.0 to about 30.0 percent by weight of hydroxylamine, about 5.0 to about 15.0 percent by weight of the alkanolamine-based compound, about 1.0 to about 10.0 percent by weight of the morpholine-based compound, about 30.0 to about 70.0 percent by weight of the polar solvent, about 0.1 to about 5.0 percent by weight of the corrosion preventing agent, and remaining water.

In example embodiments of the present invention, the alkanolamine-based compound may include monoethanolamine, diethanolamine, triethanolamine, glycolamine, diglycolamine or monoisopropanolamine. These can be used alone or in a mixture thereof.

In example embodiments of the present invention, the morpholine-based compound may include morpholine, N-methyl morpholine or N-methyl morpholine N-oxide. These can be used alone or in a mixture thereof.

In example embodiments of the present invention, the polar solvent may include dimethyl acetamide, N-methyl pyrrolidone, dimethyl formamide or dimethyl sulfoxide. These can be used alone or in a mixture thereof.

In example embodiments of the present invention, the corrosion preventing agent may include nitrilotriacetic acid, benzotriazole, ascorbic acid or gallic acid. These can be used alone or in a mixture thereof.

In example embodiments of the present invention, the composition may have a temperature of about 40° C. to about 80° C.

According to another aspect of the present invention, there is provided a method of forming a pattern. In the method of forming the pattern, after a layer is formed on a substrate, a photoresist pattern is formed on the layer. A portion of the layer exposed by the photoresist pattern is etched using the photoresist pattern as an etching mask to form the pattern on the substrate. The photoresist pattern is removed using a composition that comprises hydroxylamine, an alkanolamine-based compound, a morpholine-based compound, a polar solvent, a corrosion preventing agent, and water.

In example embodiments of the present invention, the layer may include metal, oxide, nitride, metal nitride and/or polysilicon.

In example embodiments of the present invention, the photoresist pattern may be removed at a temperature of about 40° C. to about 80° C.

According to the present invention, a composition for removing photoresist may effectively remove a photoresist pattern and etched residues without damaging a substrate and/or a pattern including metal, nitride, oxide and/or metal nitride. Accordingly, a metal wiring, a conductive pattern and/or an insulation pattern in a semiconductor device may be precisely formed by completely removing a photoresist pattern that is used as an etching mask without damaging the metal wiring, the conductive pattern and/or the insulation pattern. Particularly, the composition may efficiently remove the photoresist pattern and etched residues generated from a pattern including a metal such as titanium or tungsten. As a result, the productivity and reliability of the semiconductor device e.g., a DRAM device, an SRAM device or a flash memory device may be considerably improved.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1:
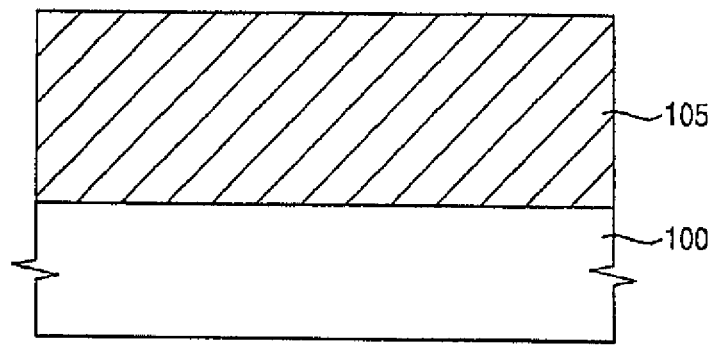
FIGS. 1 to 4 are cross-sectional views illustrating a method of forming a pattern using a composition for removing photoresist in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Composition for Removing Photoresist

In some example embodiments of the present invention, a composition for removing photoresist may include hydroxylamine (HDA), an alkanolamine-based compound, a morpholine-based compound, a polar solvent, a corrosion preventing agent and remaining water.

Hydroxylamine in the composition for removing photoresist may remove polymers generated in an etching process and also may adjust a removal rate of the polymers.

When a content of hydroxylamine (HDA) in the composition for removing photoresist is below about 5 percent by weight based on a total weight of the composition, the polymers generated in the etching process may not be effectively removed. When the content of hydroxylamine (HDA) in the composition is above about 30 percent by weight based on the total weight of the composition, a conductive structure and/or an insulation structure formed on a substrate may be damaged in the etching process. Thus, the composition for removing photoresist may include about 5 to about 30 percent by weight of hydroxylamine (HDA).

The alkanolamine-based compound in the composition for removing photoresist may expand and/or weaken photoresist so that photoresist may be easily removed from the substrate, the conductive structure and/or an insulation structure.

Examples of the alkanolamine-based compound may include monoethanolamine (MEA), diethanolamine, triethanolamine, glycolamine, diglycolamine, monoisopropanolamine, etc. These can be used alone or in a mixture thereof.

When a content of the alkanolamine-based compound in the composition is below about 5 percent by weight based on the total weight of the composition, photoresist may not be easily removed such that a time for removing photoresist may exceedingly increase. When the content of the alkanolamine-based compound is above about 15 percent by weight, a layer or a structure to be etched may be damaged. Hence, the composition for removing photoresist may include about 5 to about 15 percent by weight of the alkanolamine-based compound.

The morpholine-based compound in the composition may prevent the conductive structure and/or the insulation structure from being damaged in the etching process.

Examples of the morpholine-based compound may include morpholine, N-methyl morpholine, N-methyl morpholine N-oxide (NMMO), etc. These can be used alone or in a mixture thereof.

When a content of the morpholine-based compound in the composition is below about 1 percent by weight based on the total weight of the composition for removing photoresist, the conductive structure and/or the insulation structure may be damaged in the etching process. When the content of the morpholine-based compound in the composition is above about 10 percent by weight, a viscosity of the composition may be undesirably increased. Therefore, the composition for removing photoresist may include about 1 to about 10 percent by weight of the morpholine-based compound.

The polar solvent in the composition for removing photoresist may dissolve the expanded and/or weakened polymers, and may also dissolve photoresist and etched residues detached from the substrate, the conductive structure and/or the insulation structure. Further, the polar solvent may adjust the viscosity of the composition for removing photoresist. Accordingly, the polymers, photoresist and the etched residues may not be attached again to the substrate, the conductive structure and/or the insulation structure.

Example of the polar solvent may include dimethyl acetamide, N-methyl pyrrolidone, N,N-dimethyl acetamide (DMAC), dimethyl formamide, dimethyl sulfoxide, etc. These can be used alone or in a mixture thereof.

When a content of the polar solvent in the composition for removing photoresist is below about 30 percent by weight based on the total weight of the composition, photoresist and etched residues may not be completely dissolved or the detached, and polymers may be attached to the substrate, the conductive structure and/or the insulation structure. When the content of the polar solvent in the composition is above about 70 percent by weight, the viscosity of the composition may be relatively low. Accordingly, the composition for removing photoresist may include about 30 to about 70 percent by weight of the polar solvent.

The corrosion preventing agent in the composition may prevent an underlying wiring including metal from being corroded in a process for removing photoresist.

Examples of the corrosion preventing agent may include nitrilotriacetic acid (NTA), benzotriazole, ascorbic acid, gallic acid, etc. These can be used alone or in a mixture thereof.

When a content of the corrosion preventing agent in the composition is below about 0.1 percent by weight based on the total weight of the composition, the underlying wiring may be corroded in the process for removing a photoresist. When the content of the corrosion preventing agent in the composition is above about 5 percent by weight, the polymers and/or the etched residues may not be sufficiently removed. Thus, the composition for removing photoresist may include about 0.1 to about 5 percent by weight of the corrosion preventing agent.

Example of the remaining water in the composition for removing photoresist may include pure water with no impurities, ultra-pure water, deionized (DI) water, etc.

The remaining water in the composition may serve as a solvent that dissolves ingredients in the composition. Additionally, the viscosity and characteristics of the composition may vary depending on a content of the remaining water.

The composition for removing photoresist may effectively remove a photoresist pattern that is used as an etching mask in a process in order to form a pattern, a conductive structure, an insulation structure and/or a semiconductor is device e.g., a dynamic random access memory (DRAM) device, a static random access memory (SRAM) device, a flash memory device, etc without damaging the pattern, the conductive structure, the insulation structure and/or a substrate. Further, the composition for removing photoresist may efficiently remove polymers, etched residues and/or photoresist detached from the conductive structure, the insulation structure and/or the substrate. Particularly, the composition for removing photoresist may effectively remove metallic etched residues that are generated in an etching process to form a wiring including titanium (Ti).

Example 1

A composition for removing photoresist was prepared by mixing about 20.0 percent by weight of hydroxylamine (HDA), about 5.0 percent by weight of monoethanolamine (MEA) as the alkanolamine-based compound, about 5.0 percent by weight of N-methyl morpholine N-oxide (NMMO) as the morpholine-based compound, about 44.5 percent by weight of N,N-dimethyl acetamide (DMAC) as the polar solvent, about 0.5 percent by weight of nitrilotriacetic acid (NTA) as the corrosion preventing agent, and about 25.0 percent by weight of deionized (DI) water based on a total weight of the composition.

Example 2

A composition for removing photoresist was prepared by mixing about 5.0 percent by weight of HDA, about 10.0 percent by weight of MEA as the alkanolamine-based compound, about 5.0 percent by weight of NMMO as the morpholine-based compound, about 49.5 percent by weight of DMAC as the polar solvent, about 0.5 percent by weight of NTA as the corrosion preventing agent, and is about 30.0 percent by weight of DI water.

Example 3

A composition for removing photoresist was prepared by mixing about 5.0 percent by weight of HDA, about 15.0 percent by weight of MEA as the alkanolamine-based compound, about 7.5 percent by weight of NMMO as the morpholine-based compound, about 59.5 percent by weight of DMAC as the polar solvent, about 0.5 percent by weight of NTA as the corrosion preventing agent, and about 12.5 percent by weight of DI water.

Example 4

A composition for removing photoresist was prepared by mixing about 5.0 percent by weight of HDA, about 15.0 percent by weight of MEA as the alkanolamine-based compound, about 7.5 percent by weight of NMMO as the morpholine-based compound, about 59.8 percent by weight of DMAC as the polar solvent, about 0.2 percent by weight of NTA as the corrosion preventing agent, and about 12.5 percent by weight of DI water.

Example 5

A composition for removing photoresist was prepared by mixing about 7.5 percent by weight of HDA, about 10.0 percent by weight of MEA as the alkanolamine-based compound, about 5.0 percent by weight of NMMO as the morpholine-based compound, about 47.0 percent by weight of DMAC as the polar solvent, about 0.5 percent by weight of NTA as the corrosion preventing agent, and about 30.0 percent by weight of DI water.

Example 6

A composition for removing photoresist was prepared by mixing about 10.0 percent by weight of HDA, about 10.0 percent by weight of MEA as the alkanolamine-based compound, about 5.0 percent by weight of NMMO as the morpholine-based compound, about 44.5 percent by weight of DMAC as the polar solvent, about 0.5 percent by weight of NTA as the corrosion preventing agent, and about 30.0 percent by weight of DI water.

Example 7

A composition for removing photoresist was prepared by mixing about 7.5 percent by weight of HDA, about 10.0 percent by weight of MEA as the alkanolamine-based compound, about 2.5 percent by weight of NMMO as the morpholine-based compound, about 49.5 percent by weight of DMAC as the polar solvent, about 0.5 percent by weight of NTA as the corrosion preventing agent, and about 30.0 percent by weight of DI water.

Example 8

A composition for removing photoresist was prepared by mixing about 7.5 percent by weight of HDA, about 10.0 percent by weight of MEA as the alkanolamine-based compound, about 2.5 percent by weight of NMMO as the morpholine-based compound, about 69.5 percent by weight of DMAC as the polar solvent, about 0.5 percent by weight of NTA as the corrosion preventing agent, and about 10.0 percent by weight of DI water.

Example 9

A composition for removing photoresist was prepared by mixing about 7.5 percent by weight of HDA, about 10.0 percent by weight of MEA as the alkanolamine-based compound, about 2.5 percent by weight of NMMO as the morphoiine-based compound, about 49.5 percent by weight of DMAC as the polar solvent, about 0.5 percent by weight of NTA as the corrosion preventing agent, and about 30.0 percent by weight of DI water.

Example 10

A composition for removing photoresist was prepared by mixing about 6.0 percent by weight of HDA, about 6.0 percent by weight of MEA as the alkanolamine-based compound, about 2.0 percent by weight of NMMO as the morpholine-based compound, about 60.6 percent by weight of DMAC as the polar solvent, about 0.4 percent by weight of NTA as the corrosion preventing agent, and about 25.0 percent by weight of DI water.

Example 11

A composition for removing photoresist was prepared by mixing about 9.0 percent by weight of HDA, about 6.0 percent by weight of MEA as the alkanolamine-based compound, about 2.0 percent by weight of NMMO as the morpholine-based compound, about 57.6 percent by weight of DMAC as the polar solvent, about 0.4 percent by weight of NTA as the corrosion preventing agent, and about 25.0 percent by weight of DI water.

Example 12

A composition for removing photoresist was prepared by mixing about 6.0 percent by weight of HDA, about 6.0 percent by weight of MEA as the alkanolamine-based compound, about 5.0 percent by weight of NMMO as the morpholine-based compound, about 57.6 percent by weight of DMAC as the polar solvent, about 0.4 percent by weight of NTA as the corrosion preventing agent, and about 25.0 percent by weight of DI water.

Example 13

A composition for removing photoresist was prepared by mixing about 9.0 percent by weight of HDA, about 6.0 percent by weight of MEA as the alkanolamine-based compound, about 5.0 percent by weight of NMMO as the morpholine-based compound, about 54.6 percent by weight of DMAC as the polar solvent, about 0.4 percent by weight of NTA as the corrosion preventing agent, and about 25.0 percent by weight of DI water.

Example 14

A composition for removing photoresist was prepared by mixing about 6.0 percent by weight of HDA, about 6.0 percent by weight of MEA as the alkanolamine-based compound, about 2.0 percent by weight of NMMO as the morpholine-based compound, about 60.0 percent by weight of DMAC as the polar solvent, about 1.0 percent by weight of NTA as the corrosion preventing agent, and about 25.0 percent by weight of DI water.

Example 15

A composition for removing photoresist was prepared by mixing about 9.0 percent by weight of HDA, about 6.0 percent by weight of MEA as the alkanolamine-based compound, about 2.0 percent by weight of NMMO as the morpholine-based compound, about 57.0 percent by weight of DMAC as the polar solvent, about 1.0 percent by weight of NTA as the corrosion preventing agent, and about 25.0 percent by weight of DI water.

Example 16

A composition for removing photoresist was prepared by mixing about 6.0 percent by weight of HDA, about 6.0 percent by weight of MEA as the alkanolamine-based compound, about 5.0 percent by weight of NMMO as the morpholine-based compound, about 57.0 percent by weight of DMAC as the polar solvent, about 1.0 percent by weight of NTA as the corrosion preventing agent, and about 25.0 percent by weight of DI water.

Example 17

A composition for removing photoresist was prepared by mixing about 9.0 percent by weight of HDA, about 6.0 percent by weight of MEA as the alkanolamine-based compound, about 5.0 percent by weight of NMMO as the morpholine-based compound, about 54.0 percent by weight of DMAC as the polar solvent, about 1.0 percent by weight of NTA as the corrosion preventing agent, and about 25.0 percent by weight of Di water.

Example 18

A composition for removing photoresist was prepared by mixing about 9.0 percent by weight of HDA, about 14.0 percent by weight of MEA as the alkanolamine-based compound, about 2.0 percent by weight of NMMO as the morpholine-based compound, about 49.6 percent by weight of DMAC as the polar solvent, about 0.4 percent by weight of NTA as the corrosion preventing agent, and about 25.0 percent by weight of DI water.

Example 19

A composition for removing photoresist was prepared by mixing about 6.0 percent by weight of HDA, about 14.0 percent by weight of MEA as the alkanolamine-based compound, about 5.0 percent by weight of NMMO as the morpholine-based compound, about 49.6 percent by weight of DMAC as the polar solvent, about 0.4 percent by weight of NTA as the corrosion preventing agent, and about 25.0 percent by weight of DI water.

Example 20

A composition for removing photoresist was prepared by mixing about 9.0 percent by weight of HDA, about 14.0 percent by weight of MEA as the alkanolamine-based compound, about 5.0 percent by weight of NMMO as the morpholine-based compound, about 46.6 percent by weight of DMAC as the polar solvent, about 0.4 percent by weight of NTA as the corrosion preventing agent, and about 25.0 percent by weight of DI water.

Example 21

A composition for removing photoresist was prepared by mixing about 6.0 percent by weight of HDA, about 14.0 percent by weight of MEA as the alkanolamine-based compound, about 2.0 percent by weight of NMMO as the morpholine-based compound, about 52.0 percent by weight of DMAC as the polar solvent, about 1.0 percent by weight of NTA as the corrosion preventing agent, and about 25.0 percent by weight of DI water.

Example 22

A composition for removing photoresist was prepared by mixing about 9.0 percent by weight of HDA, about 14.0 percent by weight of MEA as the alkanolamine-based compound, about 2.0 percent by weight of NMMO as the morpholine-based compound, about 49.0 percent by weight of DMAC as the polar solvent, about 1.0 percent by weight of NTA as the corrosion preventing agent, and about 25.0 percent by weight of DI water.

Example 23

A composition for removing photoresist was prepared by mixing about 6.0 percent by weight of HDA, about 8.0 percent by weight of MEA as the alkanolamine-based compound, about 2.0 percent by weight of NMMO as the morpholine-based compound, about 58.0 percent by weight of DMAC as the polar solvent, about 1.0 percent by weight of NTA as the corrosion preventing agent, and about 25.0 percent by weight of DI water.

Example 24

A composition for removing photoresist was prepared by mixing about 6.0 percent by weight of HDA, about 10.0 percent by weight of MEA as the alkanolamine-based compound, about 2.0 percent by weight of NMMO as the morpholine-based compound, about 56.0 percent by weight of DMAC as the polar solvent, about 1.0 percent by weight of NTA as the corrosion preventing agent, and about 25.0 percent by weight of DI water.

Example 25

A composition for removing photoresist was prepared by mixing about 5.0 percent by weight of HDA, about 10.0 percent by weight of MEA as the alkanolamine-based compound, about 2.5 percent by weight of NMMO as the morpholine-based compound, about 64.9 percent by weight of DMAC as the polar solvent, about 0.1 percent by weight of NTA as the corrosion preventing agent, and about 17.5 percent by weight of DI water.

Example 26

A composition for removing photoresist was prepared by mixing about 6.5 percent by weight of HDA, about 15.0 percent by weight of MEA as the alkanolamine-based compound, about 2.5 percent by weight of NMMO as the morpholine-based compound, about 50.5 percent by weight of DMAC as the polar solvent, about 0.5 percent by weight of NTA as the corrosion preventing agent, and about 25.0 percent by weight of DI water.

Example 27

A composition for removing photoresist was prepared by mixing about 6.5 percent by weight of HDA, about 10.0 percent by weight of MEA as the alkanolamine-based compound, about 2.5 percent by weight of NMMO as the morpholine-based compound, about 55.5 percent by weight of DMAC as the polar solvent, about 0.5 percent by weight of NTA as the corrosion preventing agent, and about 25.0 percent by weight of DI water.

Example 28

A composition for removing photoresist was prepared by mixing about 5.0 percent by weight of HDA, about 13.0 percent by weight of MEA as the alkanolamine-based compound, about 2.5 percent by weight of NMMO as the morpholine-based compound, about 54.0 percent by weight of DMAC as the polar solvent, about 0.5 percent by weight of NTA as the corrosion preventing agent, and about 25.0 percent by weight of DI water.

Comparative Example 1

A composition for removing photoresist was prepared by mixing about 17.5 percent by weight of HDA, about 60.0 percent by weight of MEA as the alkanolamine-based compound, about 5.0 percent by weight of catechol as the corrosion preventing agent, and about 17.5 percent by weight of DI water.

Comparative Example 2

A composition for removing photoresist was prepared by mixing about 30.0 percent by weight of HDA, about 60.0 percent by weight of MEA as the alkanolamine-based compound, about 5.0 percent by weight of catechol as the corrosion preventing agent, and about 5.0 percent by weight of DI water.

Table 1 shows contents of ingredients in the compositions for removing photoresist according to Examples 1 to 28 and Comparative Examples 1 and 2.

Table 1

| | HDA [wt %] | MEA [wt %] | NMMO [wt %] | DMAC [wt %] | NTA [wt %] | DI Water [wt %] |
|---|---|---|---|---|---|---|
| Example 1 | 20.0 | 5.0 | 5.0 | 44.5 | 0.5 | 25.0 |
| Example 2 | 5.0 | 10.0 | 5.0 | 49.5 | 0.5 | 30.0 |
| Example 3 | 5.0 | 15.0 | 7.5 | 59.5 | 0.5 | 12.5 |
| Example 4 | 5.0 | 15.0 | 7.5 | 59.8 | 0.2 | 12.5 |
| Example 5 | 7.5 | 10.0 | 5.0 | 47.0 | 0.5 | 30.0 |
| Example 6 | 10.0 | 10.0 | 5.0 | 44.5 | 0.5 | 30.0 |
| Example 7 | 7.5 | 10.0 | 2.5 | 49.5 | 0.5 | 30.0 |
| Example 8 | 7.5 | 10.0 | 2.5 | 69.5 | 0.5 | 10.0 |
| Example 9 | 7.5 | 10.0 | 2.5 | 49.5 | 0.5 | 30.0 |
| Example 10 | 6.0 | 6.0 | 2.0 | 60.6 | 0.4 | 25.0 |
| Example 11 | 9.0 | 6.0 | 2.0 | 57.6 | 0.4 | 25.0 |
| Example 12 | 6.0 | 6.0 | 5.0 | 57.6 | 0.4 | 25.0 |
| Example 13 | 9.0 | 6.0 | .0 | 54.6 | 0.4 | 25.0 |
| Example 14 | 6.0 | 6.0 | 2.0 | 60.0 | 1.0 | 25.0 |
| Example 15 | 9.0 | 6.0 | 2.0 | 57.0 | 1.0 | 25.0 |
| Example 16 | 6.0 | 6.0 | 5.0 | 57.0 | 1.0 | 25.0 |
| Example 17 | 9.0 | 6.0 | 5.0 | 54.0 | 1.0 | 25.0 |
| Example 18 | 9.0 | 14.0 | 2.0 | 49.6 | 0.4 | 25.0 |
| Example 19 | 6.0 | 14.0 | 5.0 | 49.6 | 0.4 | 25.0 |
| Example 20 | 9.0 | 14.0 | 5.0 | 46.6 | 0.4 | 25.0 |
| Example 21 | 6.0 | 14.0 | 2.0 | 52.0 | 1.0 | 25.0 |
| Example 22 | 9.0 | 14.0 | 2.0 | 49.0 | 1.0 | 25.0 |
| Example 23 | 6.0 | 8.0 | 2.0 | 58.0 | 1.0 | 25.0 |
| Example 24 | 6.0 | 10.0 | 2.0 | 56.0 | 1.0 | 25.0 |
| Example 25 | 5.0 | 10.0 | 2.5 | 64.9 | 0.1 | 17.5 |
| Example 26 | 6.5 | 15.0 | 2.5 | 50.5 | 0.5 | 25.0 |
| Example 27 | 6.5 | 10.0 | 2.5 | 55.5 | 0.5 | 25.0 |
| Example 28 | 5.0 | 13.0 | 2.5 | 54.0 | 0.5 | 25.0 |
| Comparative Example 1 | 17.5 | 60.0 | 0.0 | 0.0 | 5.0 (Catechol) | 17.5 |
| Comparative Example 2 | 30.0 | 60.0 | 0.0 | 0.0 | 5.9 (Catechol) | 5.0 |

Evaluating Removal Efficiencies of Compositions for Removing Photoresist

Removal efficiencies of the compositions according to Examples 1 to 28 and Comparative Examples 1 and 2 were measured with respect to polymers, etching residues, a metal wirings including aluminum (Al) and a metal wirings including tungsten (W).

To evaluate the removal efficiencies of the composition for removing photoresist, first multi-layered structures were formed on silicon substrates. Each of the first multi-layered structures included a silicon oxide layer, an aluminum (Al) layer, and a titanium/titanium nitride (Ti/TiN) layer. After photoresist patterns were formed on the first multi-layered structures, portions of the first multi-layered structures exposed by the photoresist patterns were etched to thereby form first multi-layered patterns on the substrates, respectively. Then, the compositions for removing photoresist were prepared according to Examples 1 to 28 and Comparative Examples 1 and 2, respectively.

In the meantime, second multi-layered structures were formed on silicon substrates. Each of the second multi-layered structures included a Ti/TiN layer and a tungsten (W) layer. The second multi-layered structures were partially etched using photoresist patterns as etching masks to thereby form second multi-layered patterns on the substrates.

After the compositions, according to Examples 1 to 28 and Comparative Examples 1 and 2, were stored in bickers, samples including the first multi-layered patterns were immersed into the compositions for about 10 minutes. Here, each of the compositions may have a temperature of about 60° C.

The samples including the first multi-layered patterns were rinsed using deionized water, and then the samples including the first multi-layered patterns were completely dried.

The dried samples including the first multi-layered patterns were observed using a field emission scanning electron microscope so as to evaluate etched residues and/or polymers remaining on the samples that include the first multi-layered patterns and to evaluate damages to the first multi-layered patterns.

Meanwhile, according to Examples 1 to 28 and Comparative Examples 1 and 2, after the compositions were stored in other bickers, samples including the second multi-layered patterns were immersed into the compositions for about 10 minutes. Here, each of the compositions may have a temperature of about 60° C.

The samples including the second multi-layered patterns were rinsed using deionized water, and then the samples including the second multi-layered patterns were completely dried.

The dried samples including the first multi-layered patterns were observed using the field emission scanning electron microscope so as to evaluate etched residues and/or polymers remaining on the samples that include the second multi-layered patterns and to evaluate damages to the second multi-layered patterns.

Table 2 shows the removal efficiencies of the compositions relative to the etched residues and/or the polymers. Table 2 additionally shows the damages to the Ti/TiN layers and the W layers caused by the compositions according to Examples 1 and 28 and Comparative Examples 1 and 2.

TABLE 2

| | Polymers/Etched Residues on the Silicon Oxide Layer | Polymers/Etched Residues on the Ti/TiN Layer | Damage to the Al Layer | Damage to the W Layer |
|---|---|---|---|---|
| Example 1 | A | A | A | A |
| Example 2 | A | A | A | A |
| Example 3 | B | B | A | A |
| Example 4 | B | A | A | A |
| Example 5 | A | A | A | A |
| Example 6 | A | A | A | A |
| Example 7 | A | A | B | B |
| Example 8 | A | A | A | A |
| Example 9 | A | A | B | B |
| Example 10 | B | B | B | A |
| Example 11 | B | A | A | A |
| Example 12 | A | A | A | A |
| Example 13 | A | A | A | A |
| Example 14 | A | A | A | A |
| Example 15 | A | A | A | A |
| Example 16 | A | A | A | A |
| Example 17 | A | A | A | A |
| Example 18 | B | A | A | A |
| Example 19 | B | A | B | B |
| Example 20 | B | A | A | A |
| Example 21 | B | B | A | A |
| Example 22 | B | A | B | B |
| Example 23 | A | A | A | A |
| Example 24 | A | A | A | A |
| Example 25 | A | A | A | A |
| Example 26 | A | A | A | A |
| Example 27 | A | A | A | A |
| Example 28 | A | A | A | A |
| Comparative Example 1 | B | A | C | B |
| Comparative Example 2 | B | B | C | A |

In the above Table 2, "A" indicates the polymers/etched residues did not exist on the samples including the first multi-layered patterns or the second multi-layered patterns, and also represents the damages to the aluminum layer or the tungsten layer did not take place. "B" indicates the polymers/etched residues did somewhat exist on the samples including the first multi-layered patterns or the second multi-layered patterns in predetermined limits, and also means the damages to the aluminum layer or the tungsten layer were minutely taken place. Additionally, "C" means the polymers/etched residues did considerably exist on, the samples including the first multi-layered patterns or the second multi-layered patterns over the predetermined limits, and also indicates the damages to the aluminum layer or the tungsten layer were exceedingly taken place.

As shown in the Table 2, the compositions used in Examples 1 to 28, may remove the polymers/etched residues more effectively than the composition used in Comparative Examples 1 and 2. Additionally, the compositions in Examples 1 to 28 may more efficiently reduce the damages to metal layers than the compositions in Comparative Examples 1 and 2.

Method of Forming a Pattern Using the Composition for Removing Photoresist

FIGS. 1 to 4 are cross-sectional views illustrating a method of forming a pattern using the composition for removing photoresist in accordance with example embodiments of the present invention.

Referring to FIG. 1, a layer to be patterned 105 is formed on a substrate 100. The substrate 100 may include a semiconductor substrate for a semiconductor device or a glass substrate for a flat panel display device. The layer to be patterned 105 may include metal, oxide, nitride, polysilicon, metal nitride, etc.

Example of metal in the layer to be patterned 105 may include tungsten, aluminum, titanium, tantalum, copper, etc. Examples of oxide in the layer to be patterned 105 may include boro-phosphor silicate glass (BPSG), phosphor silicate glass (PSG), undoped silicate glass (USG), spin-on-glass (SOG), flowable oxide (FOX), tetraethyl orthosilicate (TEOS), plasma-enhanced TEOS (PE-TEOS), high-density plasma chemical vapor deposition (HDP-CVD) oxide, etc. Examples of nitride in the layer to be patterned 105 may include silicon nitride, and examples of metal nitride in the layer to be patterned 105 may include titanium nitride, tungsten nitride, aluminum nitride, titanium aluminum nitride, etc.

In some example embodiments of the present invention, the layer to be patterned 105 may have a multi-layered structure that includes a metal layer, an oxide layer and/or a metal nitride layer. Alternatively, the layer to be patterned 105 may include a first oxide layer, a metal layer and a second oxide layer sequentially formed on the substrate 100.

Figure 2:
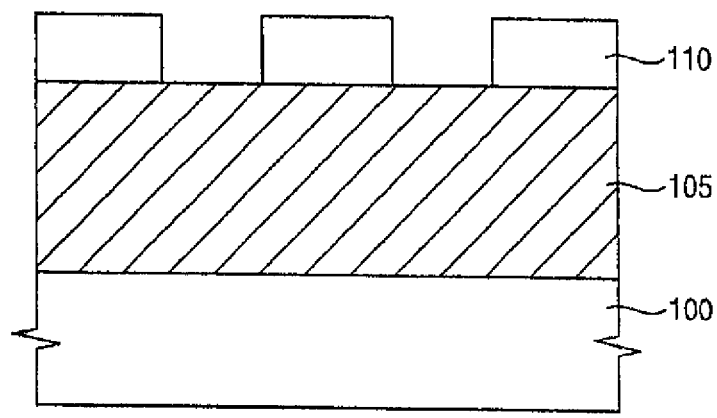

Referring to FIG. 2, a photoresist pattern 110 is formed on the layer to be patterned 105. The photoresist pattern 110 exposes a portion of the layer to be patterned 105. Particularly, a photoresist film is formed on the layer to be patterned 105 by coating a photoresist composition on the layer to be patterned 105. Then, the photoresist film is exposed and developed to thereby form the photoresist pattern 110 on the layer to be patterned 105.

Figure 3:
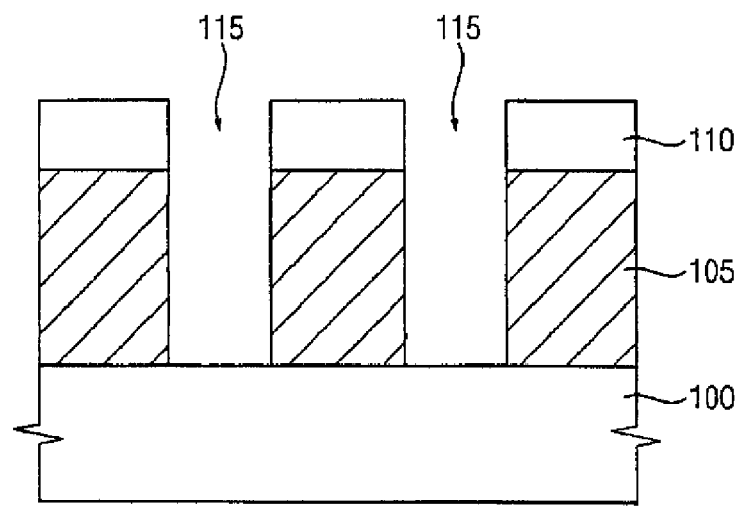

Referring to FIG. 3, the exposed portion of the layer to be patterned 105 is etched using the photoresist pattern 110 as an etching mask. Thus, a pattern 120 having an opening 115 is formed on the substrate 100. The pattern 120 may correspond to a metal wiring, a conductive pattern or an insulation pattern employed in a semiconductor device such as a DRAM device, an SRAM device or a flash memory device.

In one example embodiment of the present invention, the pattern 120 may be formed through a dry etching process using an etching gas. Alternatively, the pattern 120 may be formed by a wet etching process using an etching solution.

In the formation of the pattern 120 by the etching process, etched residues are generated on the pattern 120, a sidewall of the opening 115 and the substrate 100. Examples of the etched residues may include organic compounds, polymers including oxide, metallic polymers and/or compounds thereof.

The conventional cleaning solution for removing photoresist may not properly remove the etched residues from the pattern 120 and the substrate 100. Particularly, the conventional cleaning solution may not remove metallic polymers generated from a pattern including metal such as titanium or tungsten.

Figure 4:
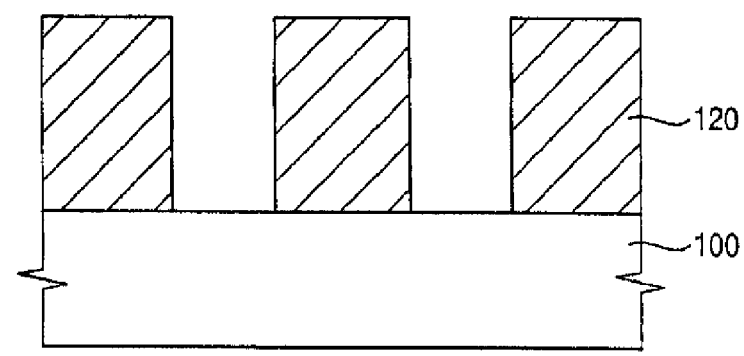

Referring to FIG. 4, the photoresist pattern 110 is removed from the pattern 120, the sidewall of the opening 115 and the substrate 100 using the above-described composition for removing photoresist.

To remove the photoresist pattern completely, the composition is prepared by mixing hydroxylamine (HDA), the alkanolamine-based compound, the morpholine-based compound, the polar solvent, the corrosion preventing agent and water. For example, the composition may include about 5.0 to about 30.0 percent by weight of hydroxylamine, about 5.0 to about 15.0 percent by weight of the alkanolamine-based compound, about 1.0 to about 10.0 percent by weight of the morpholine-based compound, about 30.0 to about 70.0 percent by weight of the polar solvent, about 0.1 to about 5.0 percent by weight of the corrosion preventing agent, and a remaining water.

The composition may effectively remove the photoresist pattern 110 and the etched residues including titanium or tungsten.

In example embodiments of the present invention, the photoresist pattern 110 and the etched residues may be removed using a batch type cleaning apparatus or a single type cleaning apparatus. A process time for removing the photoresist pattern 110 and the etched residues may be properly adjusted. That is, a time for providing the composition onto the substrate 100 may be advantageously controlled in accordance with an amount of the etched residues, a type of the etched residues and/or characteristics of the pattern 120. For example, the substrate 100 having the photoresist pattern 110 may be immersed into the composition for about 5 minutes to about 30 minutes when the photoresist pattern 110 and the etched residues are removed using the batch type cleaning apparatus.

When the composition for removing photoresist has a temperature below about 40° C., a time for removing the photoresist pattern 110 and the etched residues may be considerably increased. When composition for removing photoresist has a temperature above about 80° C., damages to the pattern 120 and the substrate 100 may occur. Therefore, the composition for removing photoresist may have a temperature of about 40° C. to about 80° C.

In some example embodiments of the present invention, the composition for removing photoresist may completely remove the photoresist pattern 110 and the etched residues such as the organic compound, the metallic polymers and/or the polymers including oxide without damaging the pattern 120 and the substrate 100.

According to the present invention, a composition for removing photoresist may effectively remove a photoresist pattern and etched residues without damaging a substrate and/or a pattern including metal, nitride, oxide and/or metal nitride. Accordingly, a metal wiring, a conductive pattern and/or an insulation pattern in a semiconductor device may be precisely formed by completely removing a photoresist pattern that is used as an etching mask without damaging the metal wiring, the conductive pattern and/or the insulation pattern. Particularly, the composition may efficiently remove the photoresist pattern and etched is residues generated from a pattern including a metal such as titanium or tungsten. As a result, the productivity and reliability of the semiconductor device such as a DRAM device, an SRAM device or a flash memory device may be considerably improved.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A composition for removing photoresist, consisting essentially of:
    about 5.0 to about 30.0 percent by weight of hydroxylamine;
    about 5.0 to about 15.0 percent by weight of an alkanolamine-based compound;
    about 1.0 to about 7.5 percent by weight of a morpholine-based compound;
    about 30.0 to about 70.0 percent by weight of a polar solvent;
    about 0.1 to about 5.0 percent by weight of a corrosion preventing agent; and
    about 10.0 to about 30.0 percent by weight of water.

2. The composition for removing photoresist of claim 1, wherein the alkanolamine-based compound comprises at least one selected from the group consisting of monoethanolamine, diethanolamine, triethanolamine, glycolamine, diglycolamine and monoisopropanolamine.

3. The composition for removing photoresist of claim 1, wherein the morpholine-based compound comprises at least one selected from the group consisting of morpholine, N-methyl morpholine and N-methyl morpholine N-oxide.

4. The composition for removing photoresist of claim 1, wherein the polar solvent comprises at least one selected from the group consisting of dimethyl acetamide, N-methyl pyrrolidone, dimethyl formamide and dimethyl sulfoxide.

5. The composition for removing photoresist of claim 1, wherein the corrosion preventing agent comprises at least one selected from the group consisting of nitrilotriacetic acid, benzotriazole, ascorbic acid and gallic acid.

6. The composition for removing photoresist of claim 1, wherein the composition has a temperature of about 40° C. to about 80° C.

7. A method of forming a pattern, comprising:
    forming a layer on a substrate;
    forming a photoresist pattern on the layer;
    etching a portion of the layer exposed by the photoresist pattern using the photoresist pattern as an etching mask to form the pattern on the substrate; and
    removing the photoresist pattern using a composition that consists essentially of about 5.0 to about 30.0 percent by weight of hydroxylamine, about 5.0 to about 15.0 percent by weight of an alkanolamine-based compound, about 1.0 to about 7.5 percent by weight of a morpholine-based compound, about 30.0 to about 70.0 percent by weight of a polar solvent, about 0.1 to about 5.0 percent by weight of a corrosion preventing agent, and about 10.0 to about 30.0 percent by weight of water.

8. The method of forming the pattern of claim 7, wherein the layer comprises at least one selected from the group consisting of metal, oxide, nitride, metal nitride and polysilicon.

9. The method of forming the pattern of claim 7, wherein the alkanolamine-based compound comprises at least one selected from the group consisting of monoethanolamine, diethanolamine, triethanolamine, glycolamine, diglycolamine and monoisopropanolamine.

10. The method of forming the pattern of claim 7, wherein the morpholine-based compound comprises at least one selected from the group consisting of morpholine, N-methyl morpholine and N-methyl morpholine N-oxide.

11. The method of forming the pattern of claim 7, wherein the polar solvent comprises at least one selected from the group consisting of dimethyl acetamide, N-methyl pyrrolidone, dimethyl formamide and dimethyl sulfoxide.

12. The method of forming the pattern of claim 7, wherein the corrosion preventing agent comprises at least one selected from the group consisting of nitrilotriacetic acid, benzotriazole, ascorbic acid and gallic acid.

13. The method of forming the pattern of claim 7, wherein the photoresist pattern is removed at a temperature of about 40° C. to about 80° C.

14. The composition for removing photoresist of claim 1, wherein the composition consists essentially of:
   about 5.0 to about 30.0 percent by weight of hydroxylamine;
   about 5.0 to about 14.0 percent by weight of an alkanolmaine-based compound;
   about 1.0 to about 7.5 percent by weight of a morpholine-based compound;
   about 30.0 to about 70.0 percent by weight of a polar solvent;
   about 0.1 to about 5.0 percent by weight of a corrosion preventing agent; and
   about 10.0 to about 30.0 percent by weight of water.

* * * * *